United States Patent
Nedved et al.

(10) Patent No.: US 9,585,262 B2
(45) Date of Patent: Feb. 28, 2017

(54) MOUNTING CLIP FOR SET TOP BOX ENCLOSURES

(71) Applicant: EchoStar Technologies L.L.C., Englewood, CO (US)

(72) Inventors: Steven A. Nedved, Littleton, CO (US); Jason Matthew Fruh, Castle Rock, CO (US)

(73) Assignee: EchoStar Technologies L.L.C., Englewood, CO (US)

( * ) Notice: Subject to any disclaimer, the term of this patent is extended or adjusted under 35 U.S.C. 154(b) by 47 days.

(21) Appl. No.: 14/664,578

(22) Filed: Mar. 20, 2015

(65) Prior Publication Data

US 2016/0278226 A1 Sep. 22, 2016

(51) Int. Cl.
*A47B 81/00* (2006.01)
*H05K 5/00* (2006.01)

(52) U.S. Cl.
CPC .................. *H05K 5/0013* (2013.01)

(58) Field of Classification Search
CPC ......... G06F 1/181; H05K 5/03; H05K 5/0004; H05K 5/0221; H05K 5/0013
USPC ...................................................... 312/223.2
See application file for complete search history.

(56) References Cited

U.S. PATENT DOCUMENTS

| | | | | |
|---|---|---|---|---|
| 5,613,237 A * | 3/1997 | Bent | ...... | H04B 1/086 220/4.02 |
| 5,931,514 A * | 8/1999 | Chung | ...... | F16B 12/26 220/326 |
| 6,375,283 B1 * | 4/2002 | Kitamura | ...... | H04B 1/3833 292/81 |
| 6,808,239 B1 * | 10/2004 | Bader | ...... | H04M 1/0252 292/19 |
| 6,876,543 B2 * | 4/2005 | Mockridge | ...... | H04M 1/0249 361/752 |
| 8,020,901 B2 * | 9/2011 | Watanabe | ...... | B41J 29/00 292/80 |
| 8,371,663 B2 * | 2/2013 | Fujikawa | ...... | H04N 5/64 220/2.1 A |
| 8,451,603 B2 * | 5/2013 | Leggett | ...... | B23P 11/02 312/223.1 |
| 8,480,186 B2 * | 7/2013 | Wang | ...... | H05K 5/0013 312/223.1 |
| 2003/0043310 A1 * | 3/2003 | Cho | ...... | G02B 6/0086 349/58 |
| 2005/0057127 A1 * | 3/2005 | Chen | ...... | G06F 1/181 312/223.2 |
| 2006/0226743 A1 * | 10/2006 | Chen | ...... | G06F 1/181 312/223.2 |
| 2012/0118773 A1 * | 5/2012 | Rayner | ...... | G06F 1/1626 206/320 |
| 2012/0314354 A1 * | 12/2012 | Rayner | ...... | G06F 1/1656 361/679.01 |

(Continued)

*Primary Examiner* — Hanh V Tran
(74) *Attorney, Agent, or Firm* — Seed IP Law Group LLP (57) ABSTRACT

Various embodiments provide a set top box enclosure having a chassis and a cover. The chassis also includes a mounting clip that facilitates the coupling of the cover to the chassis. The mounting clip includes an engagement structure on the cover that engages with a mating receiving structure located along an edge of the chassis. The mounting clip attaches a side of the cover with a side of the chassis of the set top box enclosure together and facilitates tool less engagement and disengagement of that side.

18 Claims, 5 Drawing Sheets

(56) References Cited

U.S. PATENT DOCUMENTS

| | | | |
|---|---|---|---|
| 2013/0223002 A1* | 8/2013 | Chen | G11B 17/0405 361/679.33 |
| 2014/0063724 A1* | 3/2014 | Chen | G06F 21/86 361/679.33 |
| 2014/0063725 A1* | 3/2014 | Chen | G06F 21/86 361/679.33 |
| 2014/0097729 A1* | 4/2014 | Kuo | G06F 1/18 312/223.2 |
| 2014/0111069 A1* | 4/2014 | Chen | G06F 1/1658 312/223.2 |

* cited by examiner

MOUNTING CLIP FOR SET TOP BOX ENCLOSURES

BACKGROUND

Technical Field

The present disclosure generally relates to mounting clips for set top box enclosures and, more particularly, to mounting clips for attaching a cover to a chassis of a set top box enclosure.

Description of the Related Art

The manufacture and repair of set top boxes, also called set top box enclosures or housings, includes using manual labor intervention for assembly. The manual labor may include mounting internal and external components of the set top box enclosure to the set top box enclosure chassis. For example, manual labor may be used to install the system board, power supply system, and audio and video input and outputs into or onto the chassis. Manual labor intervention may also be used to install or remove the cover from the chassis.

Flexible snap clips or even mechanical screws may be used to secure the cover onto the chassis. Installing a cover of a set top box enclosure using flexible snap clips or mechanical screws requires manual labor to precisely align the cover with the chassis and then to engage the flexible snap clips or install screws to attach the cover to the chassis.

Disassembly or removal of the cover from the chassis, for example, for repairs or maintenance, requires further manual labor intervention. A repair technician may use special tools to disengage the flexible snap clips and lift the cover off of the chassis or may use screwdrivers to remove any screws that may attach the cover to the chassis.

In addition to needing manual labor intervention to install or remove, screws are also unsightly and detract from the aesthetics of a set top box enclosure.

Some set top box enclosures include access holes in the cover or the chassis to provide access to screws or flexible snap clips. These holes are unsightly and care must be taken in the placement of the access holes in order to hide the holes or to place them in inconspicuous locations in the set top box enclosure. Thus, compromises are made in set top box enclosures in order to balance the appearance of the set top box enclosure with the security of the cover and chassis connection.

BRIEF SUMMARY

In one embodiment, a set top box enclosure having a chassis and a cover is disclosed. The chassis also includes a mounting clip that facilitates the coupling of the cover to the chassis. The mounting clip includes an engagement structure on the cover that engages with a receiving structure located along an edge of the chassis. The mounting clip attaches a side of the cover with a side of the chassis of the set top box enclosure and facilitates tool less engagement and disengagement of that side.

In an additional embodiment, a set top box enclosure having a chassis and a cover coupled together with a mounting clip and flexible snap clips is disclosed. The mounting clip facilitates the coupling of the cover to the chassis and includes a cover with a arcuate extension that engages with a receiving structure located along a first side of the chassis. The flexible snap clips couple the cover to a second side of the chassis.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements are not necessarily drawn to scale, and some of these elements may be enlarged and positioned to improve drawing legibility and understanding of the features.

DETAILED DESCRIPTION

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures associated with set-top box enclosures or housings have not been shown or described in detail to avoid unnecessarily obscuring descriptions of the embodiments.

Unless the context requires otherwise, throughout the specification and claims that follow, the word "comprise" and variations thereof, such as "comprises" and "comprising," are to be construed in an open, inclusive sense, that is, as "including, but not limited to."

References throughout this specification to "one embodiment," "an embodiment," or "some embodiments" means that a particular feature, structure or characteristic described in connection with the embodiment is included in at least one embodiment. Thus, the appearances of the phrases "in one embodiment," "in an embodiment," or "some embodiments" in various places throughout this specification are not necessarily all referring to the same embodiment.

The use of ordinals such as first, second and third does not necessarily imply a ranked sense of order, but rather may only distinguish between multiple instances of an act or structure.

The headings and Abstract of the Disclosure provided herein are for convenience only and do not limit the scope or meaning of the embodiments.

Figure 1:
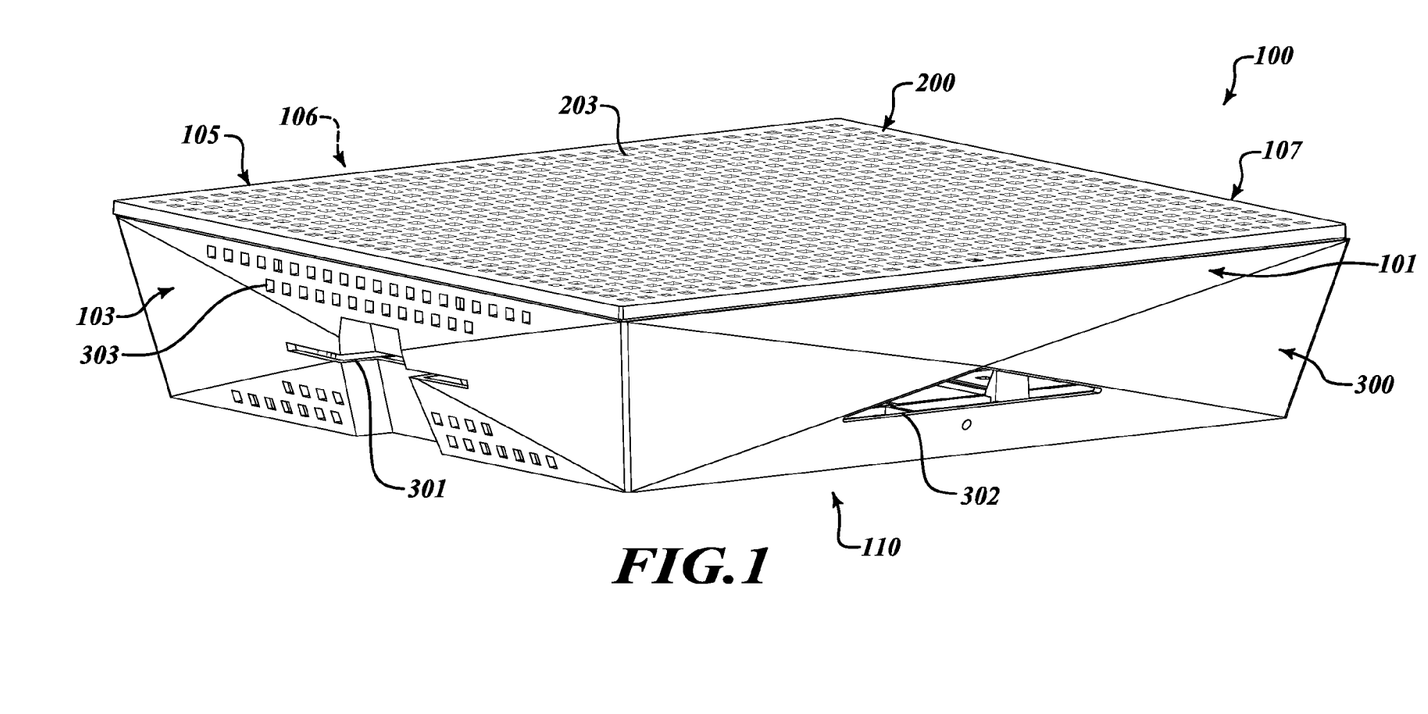
FIG. 1 is a front isometric view of a set top box enclosure according to one embodiment of the present disclosure.

FIG. 1 is a front isometric view of a set top box enclosure 100 according to one embodiment of the present disclosure. The set top box enclosure 100 includes a chassis 300 and a cover 200. The set top box enclosure 100 depicted in FIG. 1 is a four sided chassis with a front side 101, a right side 103, a back side 105, and a left side 107, each extending from a perimeter of a base 110. Although depicted as having four straight sides at approximate right angles to each other, in some embodiments, the set top box enclosure 100 may include three sides, or five or more sides. In some embodiments, the set top box enclosure 100 may have one or more rounded sides or may be a round shape, such as a circle or an oval.

The front side 101 of the enclosure 100 includes a window 302. The window may be an open aperture or may include a translucent cover. For example, the window 302 may include an infrared filter to allow infrared light from a remote control, for example, to pass from the exterior of the set top box enclosure 100 to an infrared receiver within the set top box enclosure 100. The window 302 may also include a display, such as an LCD or LED display, for displaying information regarding the status of the set top box to a user.

The right side 103 of the set top box enclosure 100 includes an aperture 301. In some embodiments, the set top box enclosure 100 may be a satellite receiver set top box enclosure. In such an embodiment, the aperture 301 may be an access card slot for inserting and removing a satellite access card. The sides of the set top box enclosure 100 may also include one or more access or ventilation apertures 303. The electronic components that may be housed within the set top box enclosure 100 may create heat during use which causes the air within the set top box enclosure 100 to heat up. The ventilation apertures 303 promote air flow exchange between the relatively hot air in the interior of the set top box enclosure 100 and the relatively cool air outside the set top box enclosure 100. Thus, the ventilation apertures 303 aid in cooling the interior of the set top box enclosure. The cover 200 of the set top box enclosure may also include ventilation apertures 203 for the same purpose, aiding in the cooling of the interior of the set top box enclosure 100 during operation. In some embodiments, one or more of the ventilation apertures may be cosmetic or blind apertures, such that they do not pass all the way through the cover. The cosmetic or blind apertures increase the surface area of the external surface of the set top box enclosure and, therefore, may also aid in cooling the set top box enclosure.

The back side 105 of the set top box enclosure 100 may include a mounting joint 106. The mounting joint 106 is a joint along which one or more mounting clips are arranged, see FIG. 2.

Figure 2:
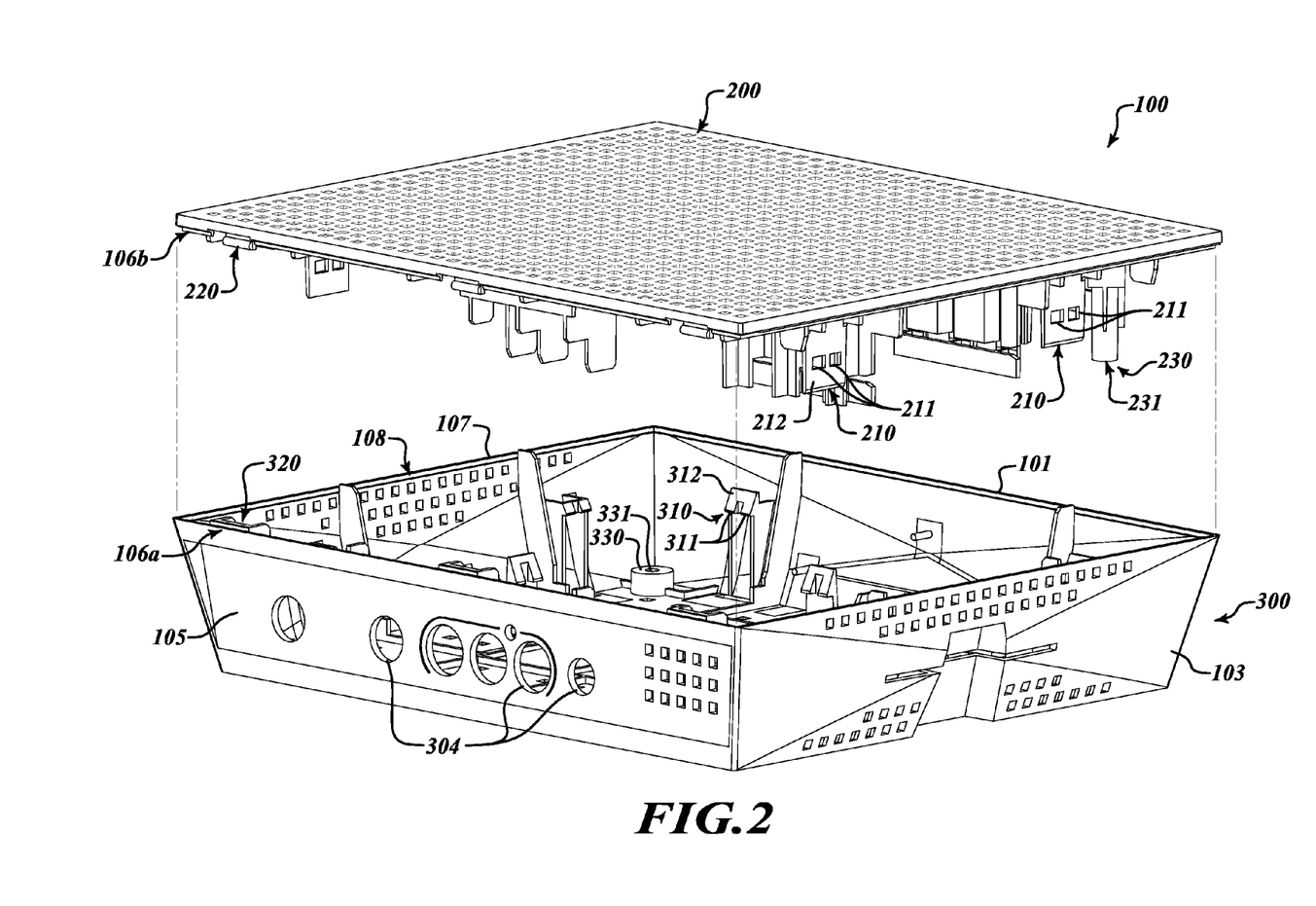
FIG. 2 is a rear isometric view of a set top box enclosure of FIG. 1 with the cover removed from the chassis according to one embodiment of the present disclosure.

FIG. 2 is a rear isometric view of the set top box enclosure 100 of FIG. 1 with the cover 200 displaced from the chassis 300. The back side 105 of the set top box enclosure 100 includes additional apertures, including input-output apertures 304. The input-output apertures 304 provide a passage way for physical audio, video, and power cables to connect to the electronic equipment housed within the set top box enclosure 100. For example, one of the input-output apertures 304 may provide for a coaxial connection between the set top box enclosure 100 and a satellite receiver dish or connection to a sound system or television.

FIG. 2 also shows three types of attachment devices for attaching the cover 200 to the chassis 300 of the set top box enclosure 100. One of the attachment devices is a screw coupling. The screw coupling includes cover stud 230 included with the cover 200 and a chassis stud 330 included with the chassis 300. The set top box enclosure 100 depicted in FIG. 2 includes a left cover stud 230, a right cover stud (not shown), a left chassis stud (not shown) and a right chassis stud 330. The cover stud 230 extends from the inner surface of the cover 200 while the chassis stud 330 extends from the inner surface of the chassis 300. As shown in FIG. 2, both the cover stud 230 and the chassis stud 330 may extend perpendicular from the plane of the inner surfaces of the cover 200 and chassis 300, respectively.

Figure 7:
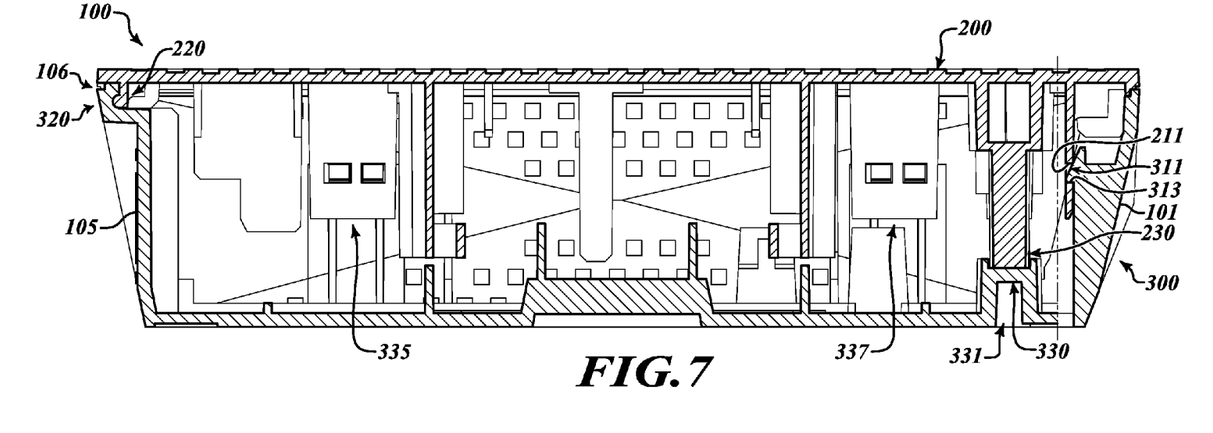
FIG. 7 is a side plan cross-sectional view of the set top box enclosure of FIG. 1 along the section line 5-5 of FIG. 4 according to one embodiment of the present disclosure.

When the cover is in a closed position, for example, as shown in FIGS. 1 and 7, the distal end of the cover stud 230 is proximate the distal end of the chassis stud 330. In some embodiments, the distal ends of the respective studs may contact each other. The chassis stud 330 may include a coupling aperture 331. The coupling aperture 331 may extend through the chassis 300 from an external surface of the chassis and through the distal end of the chassis stud 330. The coupling aperture 331 may be configured to receive a screw or other coupler for coupling or otherwise attaching the cover 200 to the chassis 300.

In some embodiments, the coupling aperture 331 may be a dimple or blind aperture that does not pass all the way through the chassis 300. A dimple or blind aperture may aid in the placement of a screw, such as a self-drilling screw, or other coupler that creates an aperture as it couples the chassis 300 and cover 200 together. In some embodiments, the chassis stud may not have an aperture 331.

The cover stud 230 may also include a coupling aperture, such as coupling aperture 231. The coupling aperture 231 may extend through the cover 200 from an external surface of the cover and through the distal end of the cover stud 230. The coupling aperture 231 may be configured to receive a screw or other coupler for coupling or otherwise attaching the cover 200 to the chassis 300. In some embodiments, the coupling aperture 231 may be a dimple or blind aperture that does not pass all the way through the cover 200. In some embodiments, the chassis stud may not have an coupling aperture 231.

In use, when the cover 200 is assembled onto the chassis 300, for example as shown in FIG. 7, a coupling such as a self-drilling screw, is inserted into the coupling aperture 231, illustrated as a blind aperture in FIG. 7. The self-drilling screw is then screwed through the chassis stud 330 and into the cover stud 230, coupling the cover 200 to the chassis 300.

Another type of attachment member is a flexible snap clip. A flexible snap clip may include a flexible assembly that engages with a hook assembly. For example, FIG. 2 shows two flexible assemblies 210 on the left side of the cover 200 and two hook assemblies 310 proximate the right front corner of the chassis 300.

The flexible assembly 210 includes a body that extends from the inner surface of the cover 200. The body may include one or more hook apertures 211 and a deflection surface 212 and is configured to bend or deflect when force is applied to the deflections surface 212. The hook assembly 310 may include a deflection surface 312 and hooks 311. The hooks 311 are configured to engage with the hook apertures 211 when the cover 200 is installed on the chassis 300.

Figure 6:
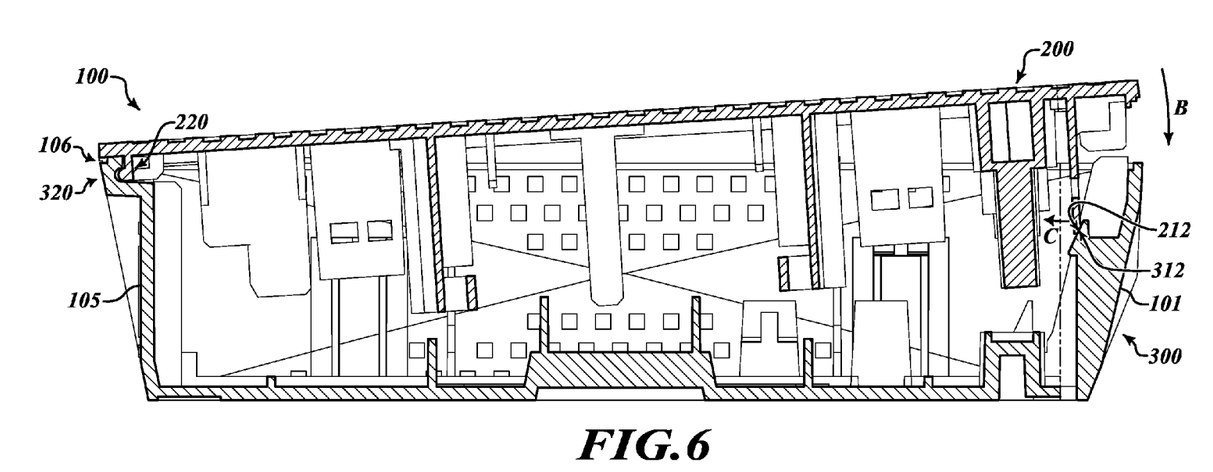
FIG. 6 is a side plan cross-sectional view of the set top box enclosure of FIG. 1 along the section line 5-5 of FIG. 4 according to one embodiment of the present disclosure.

In operation, when a person or machine is assembling the cover 200 to the chassis 300, for example as shown in FIG. 6, the cover 200 may be moved or rotated onto the chassis 300 in a direction indicated by arrow B. When moved or rotated onto the chassis 300, the cover deflection surface 212 interacts with the chassis deflection surface 312. The interaction of the two deflection surfaces 212, 312 causes the flexible assembly 210 to deflect, for example as shown in FIG. 6, towards an interior of the chassis 300 in the direction indicated by arrow C.

With continued movement of the cover 200 in the direction indicated by arrow B, the distal end of the flexible assembly 210 travels along the deflection surface 312 until, as shown in FIG. 7, the hooks 311 engage with the hook apertures 211. When the engagement surfaces 313 of the hooks 311 engage with an inner surface of the hook apertures 211, the hooks 311 resist removal of the cover 200 from the chassis 300.

To disengage the hooks 311 from the hook apertures 211, the flexible assembly 210 may be deflected away from the hooks 311 a distance sufficient to disengage the hooks 311 from the hook apertures 211. When the hooks are disengaged from the hook apertures 211, the cover 200 may be lifted off of the chassis 300. In some embodiments, a disengagement tool may be inserted into the interior of the set top box enclosure 100 and may impart a force against the flexible assembly 210 and cause it to deflect. In some embodiments, the disengagement tool may be inserted though, for example, a ventilation aperture 203, or an aperture in the chassis 300.

FIG. 2 also shows the mounting joint 106, including a mounting joint chassis structure 106a and mounting joint cover structure 106b. The mounting joint 106 may be disposed along an edge of the chassis 300 and the edge of the cover 200. For example, the mounting joint chassis structure 106a is disposed along the upper portion of the back side 105 of the chassis 300 and the mounting joint cover structure 106b is disposed along the back edge of the cover 200.

The mounting joint 106 also includes one or more mounting clips. A mounting clip includes a cover attachment member 220, shown along the mounting joint cover structure 106b and a receiving structure 320, shown along the mounting joint chassis structure 106a at a top or distal end of the sidewall. Although depicted as being along the back side 105 of the set top box enclosure, the mounting clips may be arranged along any side or edge and may be used to join other components or objects together. A clip is shown in greater detail in FIG. 3.

Figure 3:
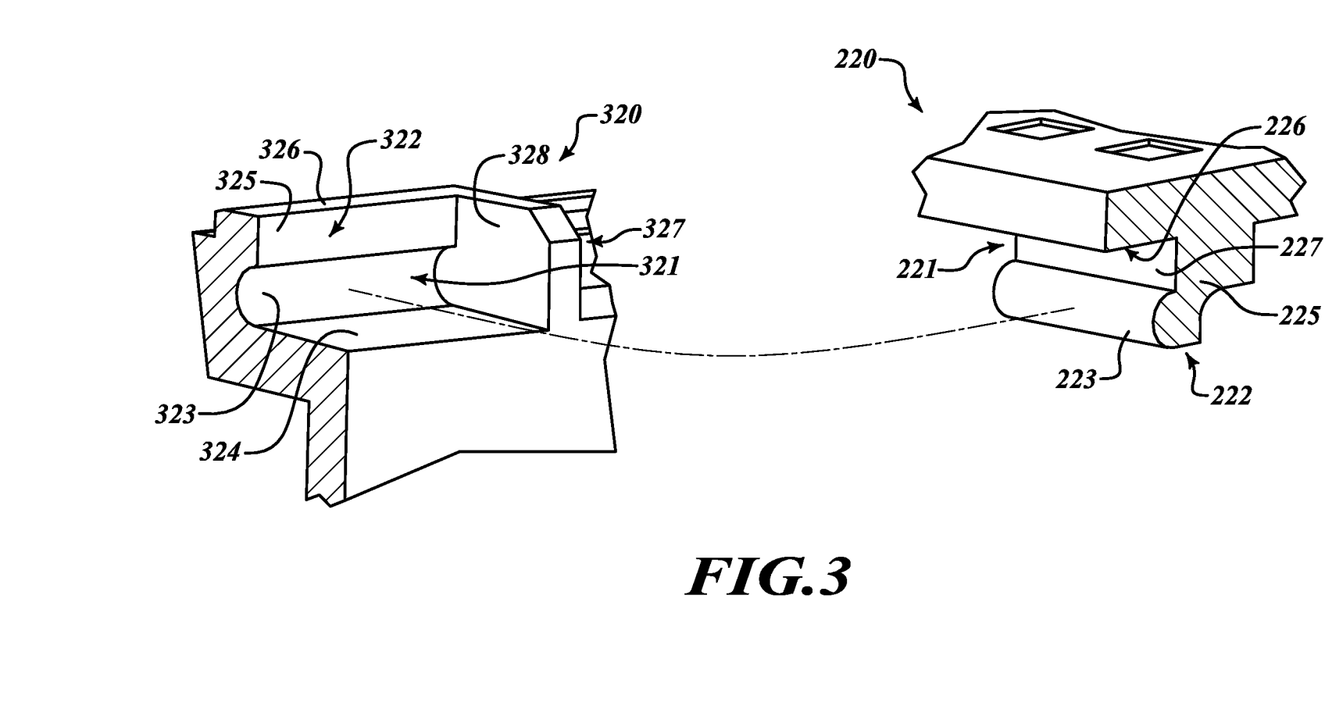
FIG. 3 is a detail cross-sectional view of a mounting clip according to one embodiment of the present disclosure.

FIG. 3 shows a detailed cross-sectional view of the receiving structure 320 of a mounting clip and the cover attachment member 220, also called an engagement structure, of a mounting clip. The receiving structure 320 of the mounting clip includes a receiver cavity 321 that is configured to receive and engage with the cover attachment member 220. The receiver cavity 321 may be defined by one or more of an inner surface 323, a lower surface or shelf 324, and one or more sidewalls 327. The lower surface or shelf 324 may extend from a bottom or proximal end of the receiver cavity 321 or surface 323. The lower surface or shelf 324 and the sidewalls 327 aid in aligning the cover attachment member 220 with the receiver cavity during assembly of the set top box enclosure 100, as described in more detail below.

An upper portion or extension 322 of the receiving structure 320 may be configured to retain the cover attachment member 220 and resist removal of the cover attachment member 220 when the cover 200 is attached to the chassis 300.

For example, as shown FIG. 7, when the cover 200 is attached to the chassis 300, the upper portion or extension 322 of the receiving structure 320 covers the extension 222 and resists upward movement of the cover 200 or movement of the cover in a direction away from the chassis 300. The upper portion or extension 322 may also be configured to be received by and engage with a cavity 221 of the cover attachment member 220 of the mounting clip.

The upper portion or extension 322 may include a first chassis locking surface 326 and a second chassis locking surface 325 and may define a distal or upper portion of the inner surface 323. The first and second chassis locking surfaces 325, 326 may extend from an end of the inner surface 323 and may join at an edge. When the receiving structure 320 engages with the attachment member 220, the first and second engagement surfaces 325, 326 may engage with corresponding cover locking surfaces 226, 227. The first cover locking surface 226 engages with the first chassis locking surface 326 and the second cover locking surface 227 engages with second chassis locking surface 325.

The cover attachment member 220 of the mounting clip includes a stud 225 that extends from the inner surface of the cover 200. The distal end of the stud 225 includes the extension or protrusion 222. The extension 222 includes an engagement surface 223 that defines the protrusion or extension 222 and is configured to engage with the inner surface 323 of the receiving structure 320. The engagement surface 223 and the inner surface 323 may have an arcuate or semicircular cross section. The engagement surface 223 and inner surface 323 may be configured to engage by, for example, the radius of curvature or shape of the engagement surface 223 matching or mating with the radius of curvature or shape of the inner surface 323 of the receiving structure 320. In some embodiments, the radius of curvature of the engagement surface 223 may be smaller than the radius of curvature of the engagement surface 223. For example, the radius of curvature of the engagement surface 223 may be 0.95 mm while the radius of curvature of the inner surface 323 of the receiving structure 320 may be 1.0 mm.

The mating of the engagement surface 223 with the inner surface 323 allows the extension 222 to rotate in the receiver cavity 321 when attaching the cover 200 to the chassis 300 as described below with respect to FIGS. 5, 6, and 7.

The cover 200, stud 225, and extension 222 of the cover attachment member 220 form the cavity 221. The cavity 221 may be sized and shaped, or otherwise configured, to receive or engage with the upper portion or extension 322 of the receiving structure 320 of the mounting clip. Receiving or engaging the upper portion or extension 322 of the receiving structure 320 within the cavity 221 aids in keeping the cover 200 attached to the chassis 300 by resisting movement of the cover 200 away from the chassis 300.

Figures 4, 5:
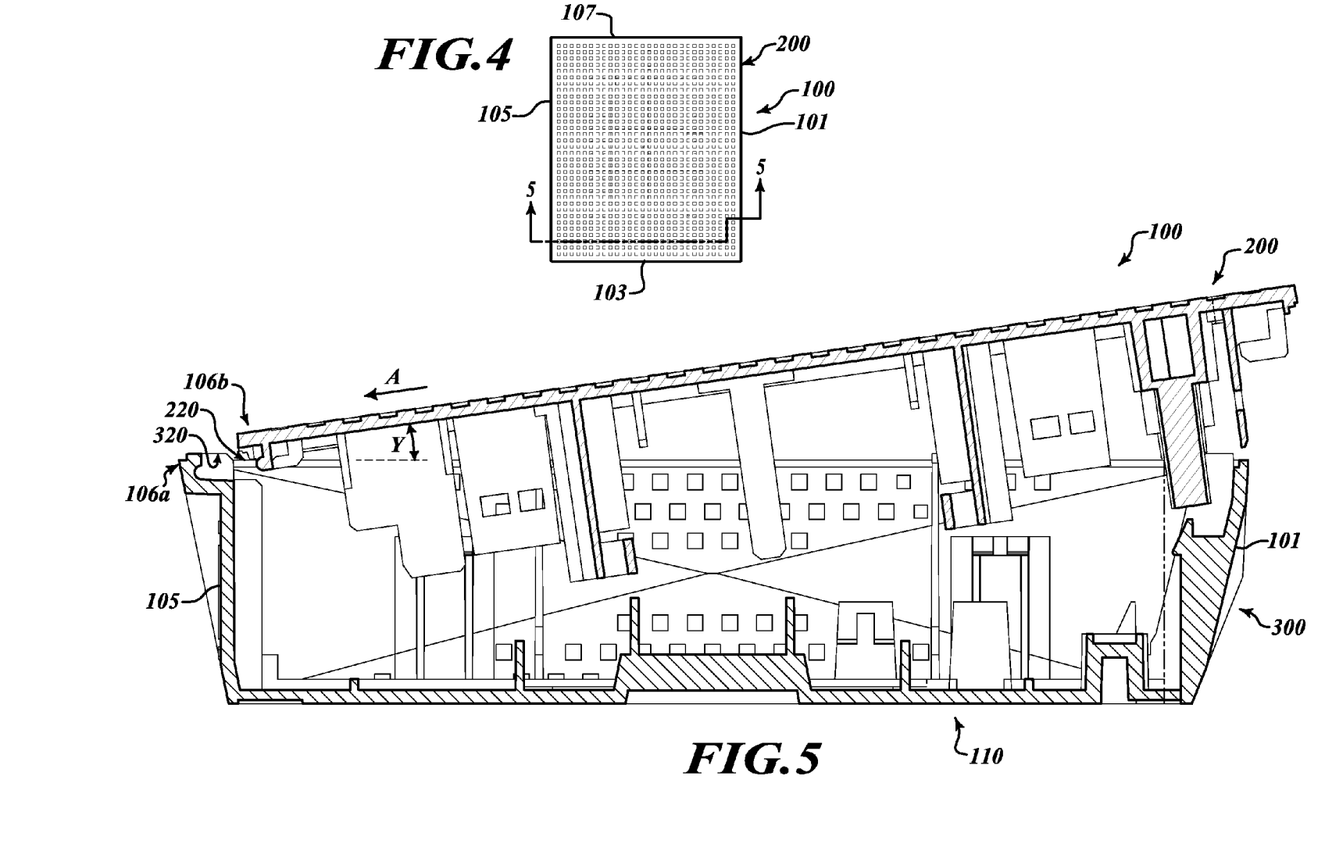
FIG. 4 is a top plan view the set top box enclosure of FIG. 1 according to one embodiment of the present disclosure.
FIG. 5 is a side plan cross-sectional view of the set top box enclosure of FIG. 1 along the section line 5-5 of FIG. 4 according to one embodiment of the present disclosure.

FIG. 4 shows a top view of the set top box enclosure 100. Section line 5-5 shows the section along which FIGS. 5, 6, and 7, are drawn. FIGS. 5, 6, and 7 show an embodiment of a process of using a mounting clip to assemble the set top box enclosure 100.

In FIG. 5, the cover 200 is held above the chassis 300 at an angle Y with the chassis. The back edge of the cover 200 and, more particularly, the mounting joint cover structure 106b, is also aligned with the top edge of the back side 105 of the chassis 300 and, more particularly, with the mounting joint chassis structure 106a.

The angle Y is preferably between 3 and 13 degrees and more preferably approximately 8 degrees. The angle Y between 3 and 13 degrees, and preferably approximately 8 degrees, allows the cover attachment member 220 to approach and engage with the receiving structure 320. In some embodiments, as the cover 200 approaches the chassis 300 as indicated by arrow A, the distal end of the stud 225 or the top of the extension 222 contacts the lower surface or shelf 324 of the receiving structure 320 and rides along the lower surface or shelf 324 until the cover attachment member 220 engages with the receiving structure 320 and, more particularly, into the receiver cavity 321. The stud 225 may also contact an inner surface 328 of the sidewall 327 located adjacent the receiving structure 320. A side of the extension 222 may contact the inner surface 328, which may also aid in guiding the extension 222 into the receiving structure 320. In this way, the bottom surface or shelf 324 and the sidewalls 327 may aid in guiding the cover 200 to the chassis 300 when the assembly person would not or could not otherwise precisely align and engage the cover attachment member 220 with the receiving structure 320.

FIG. 6 shows the set top box enclosure 100 with the cover attachment member 220 in initial engagement with the receiving structure 320 and with the cover 200 partially attached to the chassis 300. As shown in FIG. 6, the engagement surface 223 of extension 222 is engaging with the inner surface 323 of the receiving structure 320.

With the engagement surface 223 engaging with the inner surface 323, the mounting clip acts as a hinge. This allows the cover 200 to rotate with respect to chassis 300 about an axis that is parallel to the mounting joint 106. The rotation may be towards the chassis, for example, in the direction indicated by arrow B.

As also shown in FIG. 6, when the cover is moved or rotated onto the chassis 300 one or more of the flexible snap clips may begin to engage. For example, in FIG. 6, the cover deflection surface 212 of a flexible snap clip begins to interact with the chassis deflection surface 312. Further rotation of the cover 200 may cause the flexible assembly 210 to deflect towards an interior of the chassis 300 in the direction indicated by arrow C.

With continued movement of the cover 200 in the direction indicated by arrow B, the distal end of the flexible assembly 210 travels along the deflection surface 312 until, as shown in FIG. 7, the hooks 311 engage with the hook apertures 211. When the engagement surfaces 313 of the hooks 311 engage with an inner surface of the hook apertures 211, the hooks 311 resist removal of the cover 200 from the chassis 300. Additional flexible snap clips, such as the snap clips 335 and 337, may also engage as the cover 200 is rotated onto the chassis 300.

As the cover 200 is rotated into place over the chassis 300, the cover attachment member 220 fully engages with the receiving structure 320 of the mounting clip. When the mounting clip is fully engaged, the extension 222 is engaged with the receiver cavity 321 and the upper portion or extension 322 of the receiving structure 320 is engaged with the cavity 221 of the cover attachment member 220.

As also shown in FIG. 7, when the cover 200 is in place over the chassis 300, the flexible snap clip couples the cover 200 to the chassis 300 by engaging the hooks 311 with the hook apertures 211. Such engagement resists removal of the cover 200 from the chassis 300.

The cover 200 may also be coupled to the chassis 300 via the cover stud 230 and the chassis stud 330. For example, a self-drilling screw may be inserted into coupling aperture 331 and screwed through the distal end of the chassis stud 330 and into the distal end of the cover stud 230.

In this way, the cover 200 may be coupled to the chassis 300 of the set top box enclosure 100. By using the mounting clips along the mounting joint 106, the back side 105 of the chassis 300 remains clean and free of apertures for accessing flexible clips, screws, or other couplers that may otherwise be used to engage the back of the cover 200 with the chassis 300.

To disengage the cover 200 from the chassis 300, the snap clips and screw couplings along the right, left, and front of the set top box enclosure 100 are first disengaged using manual labor intervention and then the cover 200 is rotated up and away from the chassis 300, for example in a direction opposite the direction indicated by arrow B of FIG. 6. After the cover 200 is rotated up, the mounting clips along the back of the set top box enclosure 100 disengage and the cover 200 is removed from the chassis 300 without further manual intervention as the back of the set top box enclosure.

The manual labor intervention used to disengage the snap clips may include using a probe inserted through an aperture in the set top box enclosure and pushed against the flexible assembly 210 to deflect the flexible assembly 210 away from the hooks 311 a distance sufficient to disengage the hooks 311 from the hook apertures 211. The manual labor intervention used to disengage the screw couplings may include using a screw driver to unscrew the screw that couples the chassis stud 330 to the cover stud 230.

After the snap clips and the screw couples are disengaged, no further manual labor intervention is necessary to remove the cover 200 from the chassis 300. The cover is simply rotated up and away from the chassis 300, for example in a direction opposite the arrow B of FIG. 6, to disengage the mounting clips and remove the cover 200.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A set top box enclosure comprising:
a chassis including an interior defined by a base and a first sidewall extending from a perimeter of the base in a first direction;
a cover having a perimeter and a first surface that faces the interior of the chassis;
an engagement structure that extends from the first surface of the cover at the perimeter, the engagement structure including:
an engagement structure stud having a first end coupled to the first surface of the cover and a second end opposite to the first end; and
a protrusion extending from the second end of the stud, the protrusion having a semicircular cross section;
a receiving structure at a distal end of the first sidewall, the receiving structure including:
a ledge having a second surface extending in a second direction that is substantially perpendicular to the first direction;
a cavity configured to mate with the protrusion of the engagement structure to aid in securing the cover to the chassis; and
an extension having a third surface extending in the first direction and a fourth surface extending in the second direction, the extension being spaced from the ledge by the cavity, the third surface and the fourth surface being in contact with the engagement structure stud and the first surface, respectively, when the cavity is mated with the protrusion;
a cover stud extending from the first surface of the cover; and a chassis stud extending from the base of the chassis and configured to engage with the cover stud to aid in securing the cover to the chassis.

2. The set top box enclosure of claim 1, wherein the receiving structure includes an inner surface defining at least a portion of the cavity, and the protrusion is configured to contact the inner surface of receiving structure when the cavity is mated with the protrusion.

3. The set top box enclosure of claim 2, wherein the inner surface of the cavity of the receiving structure has a semicircular cross section having a first radius of curvature.

4. The set top box enclosure of claim 3, wherein the semicircular cross section of the protrusion has a second radius of curvature.

5. The set top box enclosure of claim 4, further comprising:
a flexible assembly extending from the first surface of the cover; and
a hook assembly extending from the chassis, the hook assembly configured to engage with the flexible assembly to aid in securing the cover to the chassis.

6. The set top box enclosure of claim 5, wherein the hook assembly includes a hook having an engagement surface and the flexible assembly includes a hook aperture configured to engage with the engagement surface of the hook.

7. The set top box enclosure of claim 6, wherein the hook assembly is located proximate the perimeter of the cover and opposite the engagement structure.

8. The set top box enclosure of claim 1 further comprising at least one sidewall adjacent a side of the receiving structure.

9. The set top box enclosure of claim 1, wherein the engagement structure includes a cavity defined by the first surface of the cover, the engagement structure stud, and the protrusion.

10. The set top box enclosure of claim 9, wherein the cavity of the engagement structure is configured to engage with the extension of the receiving structure.

11. The set top box enclosure of claim 1, wherein the first surface of the cover faces the base of the chassis when the cavity of the receiving structure is mated with the protrusion of the engagement structure.

12. A housing comprising:
a first housing member including a base, a first sidewall extending from a perimeter of the base, and a receiving structure, the receiving structure including:
an arcuate recess on the first sidewall; and
a lip that is spaced from the base by the arcuate recess; and
a second housing member including a perimeter, a surface, and an engagement structure on the surface, the engagement structure including:
a stud extending from the surface of the second housing member at the perimeter of the first housing member; and
an arcuate extension positioned at an end of the stud, the arcuate extension configured to be inserted in to the arcuate recess; and
a cavity defined by the surface, the stud, and the arcuate extension, the lip configure to be inserted in to the cavity, the surface being spaced from the arcuate extension by the cavity, the lip being in contact with the surface, the stud, and the arcuate extension when the lip is inserted in to the cavity.

13. The housing of claim 12, wherein the receiving structure further includes a platform having a surface, the platform being spaced from the lip by the arcuate recess, the surface of the platform being in contact with the arcuate extension when the arcuate extension is inserted in to the arcuate recess.

14. The housing of claim 12, wherein the arcuate recess has a semicircular cross section having a first radius of curvature.

15. The housing of claim 14, wherein a cross section of a surface of the arcuate extension is semicircular and has a second radius of curvature, the surface of the arcuate extension configured to mate with the surface of the arcuate recess.

16. The housing of claim 12 further comprising at least one sidewall adjacent a side of the arcuate recess and configured to receive and guide the arcuate extension into the arcuate recess.

17. The housing of claim 12, further comprising:
a flexible assembly extending from the surface of the cover; and
a hook assembly extending from the chassis, the hook assembly configured to engage with the flexible assembly to aid in securing the cover to the chassis.

18. The set top box enclosure of claim 17, wherein the hook assembly includes a hook having an engagement surface and the flexible assembly includes a hook aperture configured to engage with the engagement surface of the hook.

* * * * *